(12) United States Patent
Ellert et al.

(10) Patent No.: US 8,689,734 B2
(45) Date of Patent: Apr. 8, 2014

(54) DEPOSITION OF ACTIVE FILMS

(75) Inventors: Christoph Ellert, Walenstadt (CH);
Werner Wieland, Malans (CH); Daniele Zorzi, Ermenswil (CH); Abed al hay Taha, Chur (CH)

(73) Assignee: Tel Solar AG, Trubbach (CH)

( * ) Notice: Subject to any disclaimer, the term of this patent is extended or adjusted under 35 U.S.C. 154(b) by 768 days.

(21) Appl. No.: 12/680,239

(22) PCT Filed: Sep. 16, 2008

(86) PCT No.: PCT/CH2008/000385
§ 371 (c)(1),
(2), (4) Date: May 14, 2010

(87) PCT Pub. No.: WO2009/043190
PCT Pub. Date: Apr. 9, 2009

(65) Prior Publication Data
US 2011/0162582 A1 Jul. 7, 2011

Related U.S. Application Data

(60) Provisional application No. 60/976,593, filed on Oct. 1, 2007.

(51) Int. Cl.
*C23C 16/509* (2006.01)
*C23C 16/455* (2006.01)

(52) U.S. Cl.
USPC .............. 118/723 E; 156/345.44; 156/345.47

(58) Field of Classification Search
USPC ................... 118/723 E; 156/345.44, 345.47
See application file for complete search history.

(56) References Cited

U.S. PATENT DOCUMENTS

| | | | |
|---|---|---|---|
| 6,228,438 B1 | 5/2001 | Schmitt | |
| 6,631,692 B1 | 10/2003 | Matsuki et al. | |
| 2011/0162582 A1* | 7/2011 | Ellert et al. | 118/723 E |

FOREIGN PATENT DOCUMENTS

| | | |
|---|---|---|
| EP | 1594161 A1 | 11/2005 |
| EP | 1691396 A2 | 8/2006 |

(Continued)

OTHER PUBLICATIONS

International Search Report for PCT/CH2008/000385 dated Jan. 29, 2009.

(Continued)

*Primary Examiner* — Sylvia R MacArthur
(74) *Attorney, Agent, or Firm* — Pearne & Gordon LLP

(57) ABSTRACT

A plasma reactor (1) for treating a substrate (40), comprises at least two electrodes (20, 30) arranged within the reactor (1) defining an internal process space (13) there between, whereas the two electrodes (20, 30) are located opposed to each other and parallel with respect to a first surface (20a) of the electrodes (20, 30). Further it comprises a gas inlet (11) and a gas outlet (12) for transporting gas in and out of the plasma reactor (1), a radiofrequency generator (21) connected to at least one of the electrodes (20, 30). At least one of the electrodes (20, 30) has a corrective layer having a non planar shape along a surface (20a) facing the internal process space (13) which has in a first cross section along a radius of the electrode (20) a profile comprising three consecutive and adjacent segments, namely a first, a second and a third segment, where the third segment is adjacent to an edge of the electrode (20) and whereas medium gradient in the first segment is less than a medium gradient in the second segment and a medium gradient in the second segment is larger than a medium gradient in the third segment. An electrode (20) shaped in the above described manner provides for uniform plasma intensity along the surface of the substrate (40) and therefore provides for a treating which is homogenous and features uniform thickness. This invention further allows a compact construction of the vacuum treatment apparatus (1).

9 Claims, 3 Drawing Sheets

(56) References Cited

FOREIGN PATENT DOCUMENTS

| WO | 0111658 A1 | 2/2001 |
| WO | 2005024891 A3 | 3/2005 |

OTHER PUBLICATIONS

Written Opinion for PCT/CH2008/000385 dated Jan. 29, 2009.

* cited by examiner

DEPOSITION OF ACTIVE FILMS

TECHNICAL FIELD

The invention relates to a plasma reactor for treating a substrate, comprising at least two electrodes arranged within the reactor defining an internal process space there between, whereas the two electrodes are located opposed to each other and parallel with respect to a first surface of the electrodes. The reactor further comprises a gas inlet and a gas outlet for transporting gas in and out of the plasma reactor and a radiofrequency generator connected to at least one of the electrodes whereas at least one of the electrodes has a corrective layer having a non planar shape along a surface facing the internal process space.

BACKGROUND ART

Such reactors are known as "capacitive" RF glow discharge reactors, or planar plasma capacitors or parallel plate RF plasma reactors, or named as a combination of the above terms. Capacitive RF plasma reactors are typically used for exposing a substrate to the processing action of a glow discharge. Various processes are used to modify the nature of the substrate surface. Depending on the process and in particular the nature of the gas injected into the glow discharge, the substrate properties can be modified (adhesion, wetting), a thin film may be added (chemical vapour deposition CVD, plasma enhanced CVD PECVD, diode sputtering) or another thin film selectively removed (dry etching).

Prior Art U.S. Pat. No. 6,228,438 (Jacques Schmitt et al.) is herewith incorporated by reference. In vacuum plasma deposition technology an important problem was noted especially if the RF frequency used in a vacuum treatment apparatus is higher than 13.56 MHz and a large size (surface) substrate is used, in such a way that the reactor size is no more negligible relative to the free space wave length of the RF electromagnetic wave. Then, the plasma intensity along the reactor can no longer be uniform. Physically, the origin of such a limitation should lie in the fact that the RF wave is distributed according to the beginning of a "standing wave" special oscillation within the reactor. Other non uniformities can also occur in a reactor, for example non uniformities induced by the reactive gas provided for the plasma process. U.S. Pat. No. 6,228,438 presents a so called dielectric lens as a corrective measure in order to generate a selected RF voltage distribution in the plasma discharge in a vacuum substrate treatment apparatus. This "tailored extra-capacitor" corresponding to the above-mentioned substantially "dielectric layer" (or lens) acts as a component of a capacitive divider. Advantageously, the capacitive variations will be obtained through a non uniform thickness of the layer. Thus, the extra-capacitor will have a profile having a non planar shape along a surface.

FIG. 1 shows an apparatus 1 according to U.S. Pat. No. 6,228,438 with electrodes 3 and 5, an RF power source 9 and substrate 15. A corrective dielectric lens 11 is incorporated in the lower electrode 5 in order to generate a selected RF voltage distribution in the plasma discharge space 13.

U.S. Pat. No. 6,228,438 describes several embodiments of said principle, a relevant one being displayed and explained further below:

One solution in the invention for tailoring said "corrective layer" is to shape at least one surface of the layer in such a way that the layer has a non planar-shaped external surface, preferably a curved concave surface facing the internal process space where the plasma is generated. Various ways can be followed for obtaining such a "non planar shaped" surface on the layer. According to one preferred embodiment proposed by U.S. Pat. No. 6,228,438 one designs the shape of at least one of the electrodes in such a way that said electrode has a non planar shaped surface facing the substrate, and especially exhibiting a generally curved concave surface. According to a preferred solution, said layer comprises at least one of a solid dielectric layer and gaseous dielectric layer. If the layer comprises such a gaseous dielectric layer, it will preferably be in gaseous communication with the internal process space where the plasma is generated. Such a solution is being shown in the FIG. 2.

Here the corrective dielectric lens is being realized by a space 31 integrated in upper electrode 23, limited by a homogeneous layer 21. 31a designates said profile having a non planar-shape along a surface. The profile (shape) can here be seen as in a cross section of the upper electrode. In said embodiment space 31 is filled with process gas ("gaseous dielectric layer") and layer 21 is a ceramic material ("solid dielectric layer"). Substrate 35 is being placed on the counter electrode 25.

The solution presented in U.S. Pat. No. 6,228,438 is of great advantage for depositing homogeneous thin films of amorphous structure, where a uniform deposition rate but no additional structural constraints have to be met.

However, in layers where structure and/or composition plays a crucial role for the proper functioning of the electro-optical device, additional plasma parameters besides the electrical field strength (field distribution) need to be controlled over the entire surface of the work piece (substrate). It turns out that deposition chambers optimized for depositing layers with homogeneously distributed deposition over the entire surface are not well suited for depositing layers with homogeneous rate and homogeneous structural parameters. As an example one can consider the deposition of microcrystalline silicon layer (abbreviated µc-Si). Here the deposition rate depends to a major part on the density of a particular type of Silane radicals. However for obtaining the proper crystalline structure the concentration of atomic hydrogen, ground state, ionized and/or excited states, respectively, is relevant as well. The hydrogen bombardment and/or its chemical processes with the upper mono-atomic layers of the growing pc-Si film significantly influences the structural arrangement of the layer. This function can not be carried out by molecular hydrogen. For this reason any loss mechanism of atomic hydrogen, for example the recombination into molecular hydrogen, results in an insufficient layer quality. One loss mechanism is for example hydrogen recombination on surfaces, like the reactor walls. For example for µc-Si layers the edges of the deposited silicon layer on the substrate are not sufficiently crystalline but tend to have an amorphous fraction larger than wanted. This can not be overcome by changing the process window for the entire deposition chamber: While the plasma conditions would improve for the edges, the central region of the reactor would be shifted into process windows which lead to µc-Si layers of inferior quality compared to the optimum. The obvious solution, to simply increase the overall power of the used RF power source is not possible, since the central region also would experience an increase of power, which would again deteriorate the results in the central regions of the layer on the substrate.

Increasing the plasma reactor, in order to position the substrate in an enlarged central, optimized region is no option, because the size of the reactor, especially for large-size substrate would increase excessively as well as the consumption of energy and consumables without additional yield.

SUMMARY OF THE INVENTION

It is the object of the invention to create a corrective dielectric layer for an electrode of a plasma reactor pertaining to the technical field initially mentioned, that provides uniform plasma intensity along the surface of the substrate, especially for large size (surface) substrates and moreover allows a compact construction of the vacuum treatment apparatus.

The solution of the invention is specified by the features of claim 1. According to the invention a plasma reactor for treating a substrate as specified above comprises at least one electrode having a corrective layer having a non planar shape along a surface facing the internal process space where the non planar shape has in a first cross section along a radius of the electrode a profile comprising three consecutive and adjacent segments, namely a first (I), a second (II) and a third segment (III) where the third segment (III) is adjacent to an edge of the electrode. A medium $m_I$ gradient in the first segment is less than a medium gradient $m_{II}$ in the second segment and the medium gradient $m_{II}$ in the second segment is larger than a medium gradient $m_{III}$ in the third segment or expressed by formula:

$$m_I < m_{II} \text{ and } m_{II} > m_{III}$$

The first cross section is preferably oriented rectangular to a surface of a base plane and through the centre of the electrode. A gradient m between two points $P(x_1,y_1)$ and $Q(x_2,y_2)$ is calculated as usual by dividing a difference of y-values by a corresponding difference of x-values as $$m = \frac{y_2 - y_1}{x_2 - x_1},$$

where x and y denotes the usual coordinates of a Cartesian coordinate system and in a preferred embodiment the y-axis is oriented rectangular to the first surface of the electrode. A medium gradient between two boundary points of a segment is calculated equally as described before. In another embodiment of the invention the shape has exactly one inflection point in a cross section along a radius of the electrode.

According to the invention the edge regions of the electrode affecting the deposition (treatment) of the substrate permit an increase of the local electric field strength. Therewith a non-uniformity of the electrical field can be compensated.

An electrode shaped in the above described manner provides for uniform plasma intensity along the surface of the substrate and therefore provides for a treating which is homogenous and ensures uniform thickness. This invention solves the above mentioned technical problem and moreover allows for a cheaper and more compact construction of the vacuum treatment apparatus.

If needed, the inventive solution allows for shaping the electrode in such a way that also a non uniform treatment is possible.

In a preferred embodiment the first segment comprises a section in which the corrective layer is essential flat.

Advantageously the flat section comprises between ⅙ and ⅓, preferably about ¼ of a radius of the corrective layer.

In a preferred embodiment the medium gradient of the second segment is at least three times, preferably at least five times, larger than the medium gradient of the first and the third segment.

The medium gradient of the first segment of the electrode is advantageously between 0.003 and 0.013, preferably 0.006, the medium gradient of the second segment of the electrode is between 0.018 and 0.044, preferably 0.032, and the medium gradient of the third segment of the electrode is between 0.002 and 0.006, preferably 0.004.

According to a preferred solution, said layer comprises at least one of a solid dielectric layer and gaseous dielectric layer.

To ensure constant field strength independent of the composition of the reactive gas the gaseous dielectric layer can be decoupled from the inner space between the electrodes, e.g. by a plate. The space between the electrode and the plate can be filled by a gas or can be evacuated. In a further embodiment, the layer can be built by appropriate dielectric material such as e.g. aluminium, zirconium, quartz or any other material which further fulfils thermal and chemical compatibility specifications of the processing. However the non planar shape of the electrode has to be adjusted according to the dielectric material used. An electrode comprising a plate which has a non planar surface facing the substrate is also a solution for providing uniform thickness of the treatment, whereas the non planar shape of the electrode has to be adjusted or flattened respectively.

If the layer comprises a gaseous dielectric layer, it will preferably be in gaseous communication with the internal process space where the plasma is generated.

If the gaseous dielectric layer is in gaseous communication with the internal process space, a simple construction of the electrode can be achieved.

The invention can be applied to other profiles of electrodes. The electrode itself can be circular, square or rectangular.

Also other profiles are possible, where the profile of the electrode can be adjusted to the profile of the substrate which does not imply that the profile of the electrode is equal to the profile of the substrate. Preferably the profile of the electrode is similar (in the geometrical meaning) to the profile of the substrate but scaled-up. In a further embodiment of the invention the electrodes are at least capping the substrate. However it can not be ruled out that the profile of the electrodes are different from the profile of the substrate.

In a further embodiment the two electrodes may be shaped equally. In this case, the medium gradients are scaled accordingly.

In order to make use of the invention a method for treating at least one substrate will comprise the following steps:
1. Introducing said substrate in the internal process space (between the electrodes).
2. Evacuating the internal process space.
3. Providing gas to the internal process space via gas inlet.
4. Applying power to the internal process space via the electrodes.
5. Optionally heating, coating or etching the substrate.

Other advantageous embodiments and combinations of features come out from the detailed description below and the totality of the claims.

BRIEF DESCRIPTION OF THE DRAWINGS

The drawings used to explain the embodiments show:

FIG. 6 possible radiuses, to which the cross sectional profile may be applied to.

In the figures, the same components are given the same reference symbols.

PREFERRED EMBODIMENTS

Figure 1:
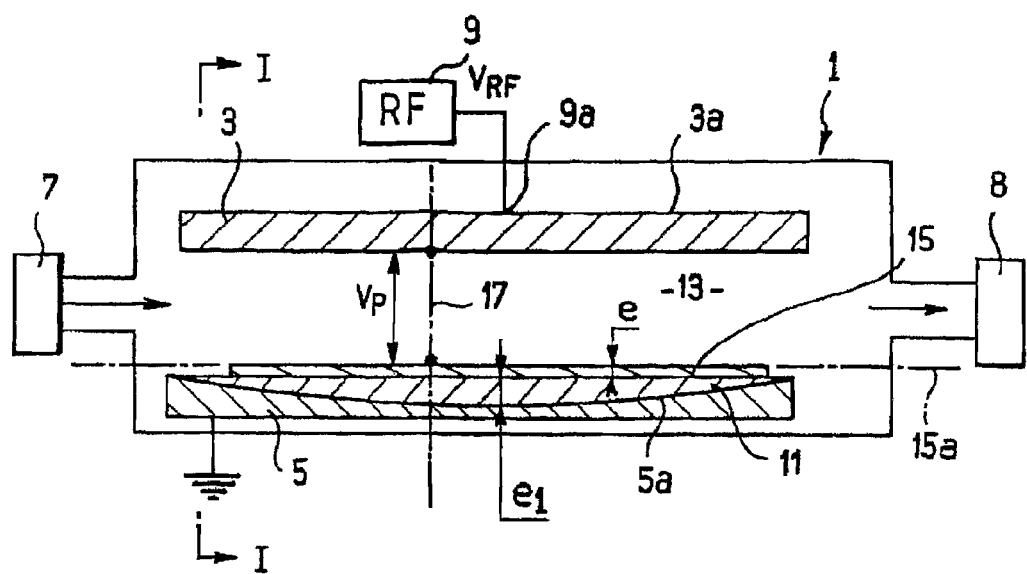
FIG. 1 a vertical cross section of a prior art apparatus according to U.S. Pat. No. 6,228,438 comprising a solid corrective dielectric lens 11.
Figure 2:
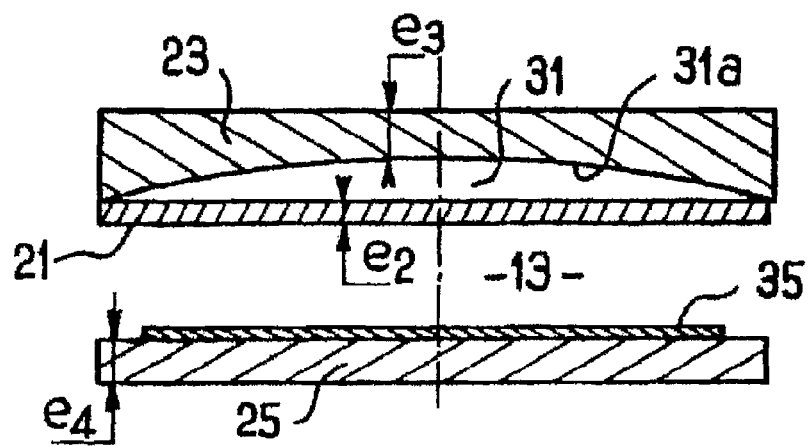
FIG. 2 a vertical cross section of a prior art apparatus according to U.S. Pat. No. 6,228,438 where a corrective dielectric lens is realized as a space 31.
Figure 3:
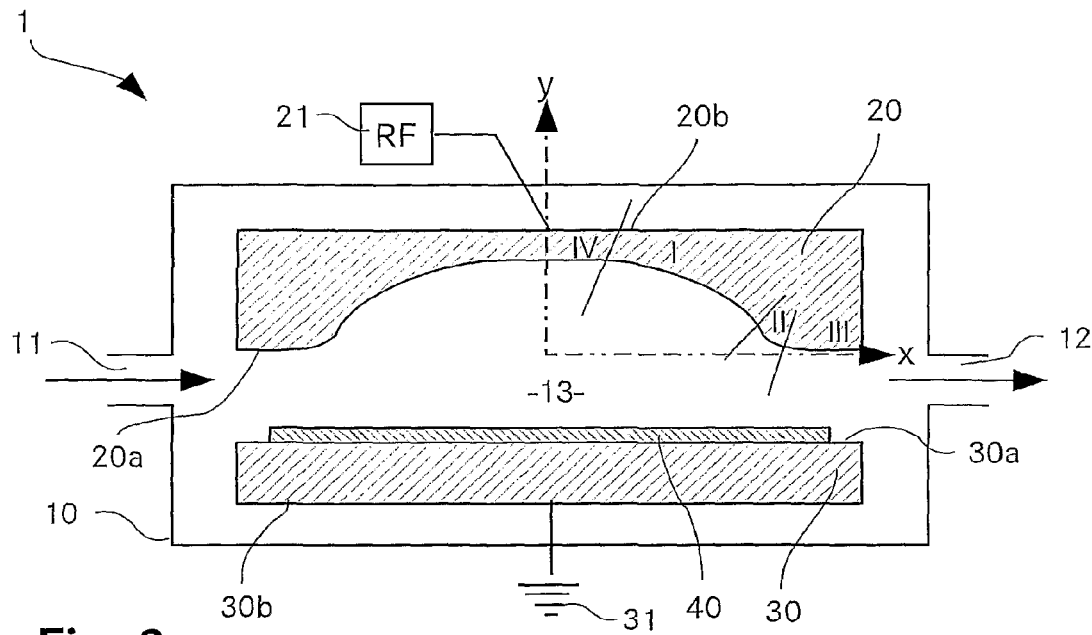
FIG. 3 a schematic illustration of a cross section of a reactor according to the invention.

FIG. 3 shows a reactor 1 comprising two conductive electrodes 20, 30 whereas the two electrodes 20, 30 are located opposed to each other and parallel with respect to a first surface of the electrodes 20, 30. The electrode 20 has a corrective layer having a non planar shape along a surface 20a facing the internal process space 13. For illustration purposes the shape along the surface 20a in FIG. 3 is shown heavily exaggerated. The effective width of the electrodes 20, 30 is about a hundred times larger than shown in FIG. 3. A radiofrequency generator 21 is connected centrally to a surface 20b of the electrode 20 which is opposed to the surface 20a of the electrode 20 and the electrode 30 is grounded by a grounding 31 connected to a surface 30b opposed to the surface 30a for generating a radiofrequency discharge between the electrodes 20, 30.

The reactor 1 further contains an enveloping casing 10 comprising a gas inlet 11 and a gas outlet 12 directed to the space 13 between the electrodes 20, 30 for providing the reactor 1 with a reactive gas in which the plasma 13 is generated by the radiofrequency generator 21 in the internal space between the two electrodes 20, 30. A substrate 40 is located between the two electrodes 20, 30, which are formed similar as the substrate 40, in the internal space and centred with respect to the electrode 20 contacting the electrode 30 so that the substrate 40 is exposed to the processing action of the plasma discharge.

Further FIG. 3 shows a coordinate plane, where the y-axis goes through the centre of the electrode 20 perpendicular to the first surface 20b of the electrode 20 and the x-axis is perpendicular to the y-axis. The electrode 20 is rotationally symmetric with respect to the y-axis. The shape of the surface 20a of the electrode 20 is subdivided along the positive x-axis into four segments which are numbered by Latin numbers. The central segment IV is essentially flat. The adjacent segment I shows a medium gradient less than the medium gradient of the segment II and the segment II shows a medium gradient larger than the medium gradient of outermost segment III.

In the context of the shown embodiment the radiofrequency generator 21 and the grounding 31 can also be exchanged or the grounding 31 may be exchanged with another radiofrequency generator (not shown). It is also possible to make use of multiple radiofrequency generators or to connect one radiofrequency generator at multiple places on the electrode 20 where in this case they are preferably located uniformly on the surface 20b of the electrode 20.

Figure 4:
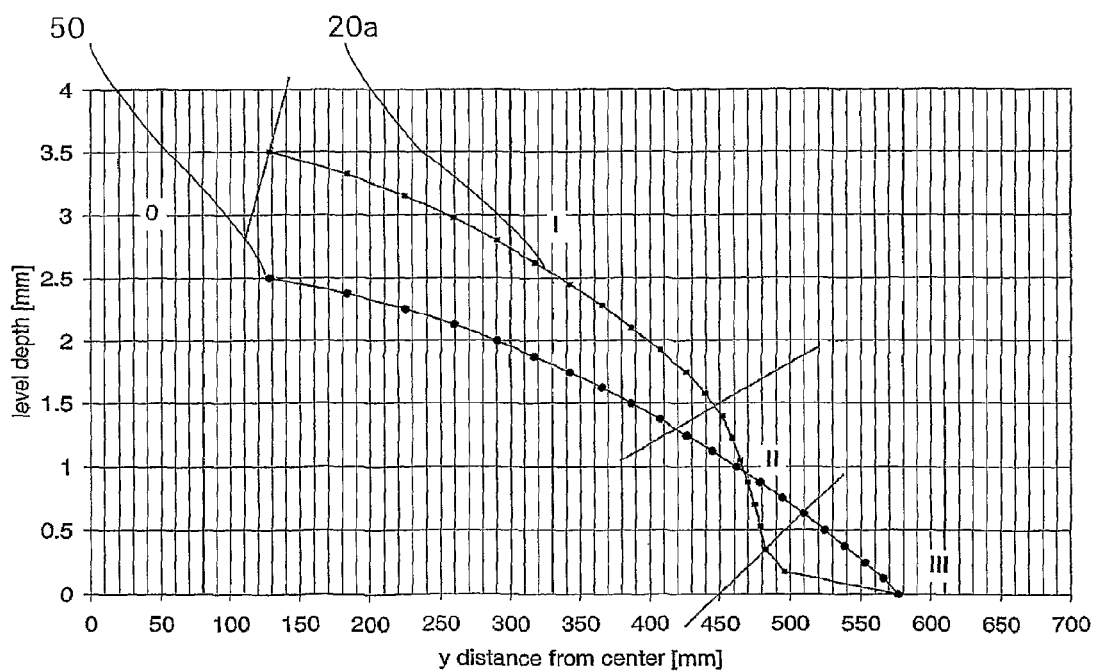
FIG. 4 a vertical cross section of one half of a profile of an electrode, where the x-axis displays the distance from the centre (radius)

The diagram in FIG. 4 shows a cross section of one half of a profile of an electrode 20 or an according dielectric layer. The centre of the electrode 20 is on the left, the x-axis displays the distance from the centre in mm. In the embodiment shown, the radius of the electrode 20/dielectric layer is about 600 mm.

The smooth curve in FIG. 4 which is marked with circles describes a curvature/shape according to U.S. Pat. No. 6,228,438 (prior art). In the left section marked "0" the shape of the surface 20a ("curvature") is essentially flat and has therefore been omitted. The other curve marked with squares corresponds to the inventive curvature of the surface 20a of the electrode 20. The central part is also essentially flat and has been omitted. The central region comprises between one ⅙ and ⅓ of the radius, preferably about ¼, as displayed in FIG. 4.

The FIG. 4 further shows a y-axis which denotes the level depth in mm, which is the deviation of the curvature from a purely flat design of the substrate facing side of the electrode 20 shown in FIG. 3. In the embodiment shown this can be seen as the depth of the recess in the electrode 20, as basically illustrated in FIG. 3. In another embodiment, this can be seen as the thickness of a dielectric layer which fills the corresponding recess of the electrode 20. The outer sections, I-III require corrective measures (increase field strength, e-density) which modify the plasma growth conditions such that said outer sections allow the growth of the desired mc-Si material quality in spite of the disturbing influences of the H-recombination on the walls and the subsequent diffusion. These correction methods can in particular increase the electric field strength, for instance to around $10^4$ V/m without plasma. This is achieved by modifying the shape of the dielectric compensating layer by giving it a form as shown in FIG. 4. The curve follows essentially the shape of an inverted S. This "S" can be subdivided into three sections I-III as indicated in FIG. 4. The basic rule or teaching takes into account the gradient of the inventive profile in the three segments. The medium gradient m in each of the segments, in absolute values is as follows:

$$m_I < m_{II} \text{ and } m_{II} > m_{III}$$

Experiments have shown that actual, absolute values for the gradient in a specific application are as follows:

| Values ×10⁻³ | Section I | Section II | Section III |
| --- | --- | --- | --- |
| Medium gradient | 6 | 32 | 4 |
| Range from | 3 | 18 | 2 |
| To | 13 | 44 | 6 |

In other words: The shape assumes a profile, whereby three sections in the outer region adjacent the edge of the profile can be identified where it is valid that the medium gradient for section II is at least 5 time larger than for both sections I and III.

The outer region is being adjacent the central region, as being defined above. Section II and III may take up essentially half of the outer region, measured in terms of the radius as displayed in FIG. 4.

Figure 5:
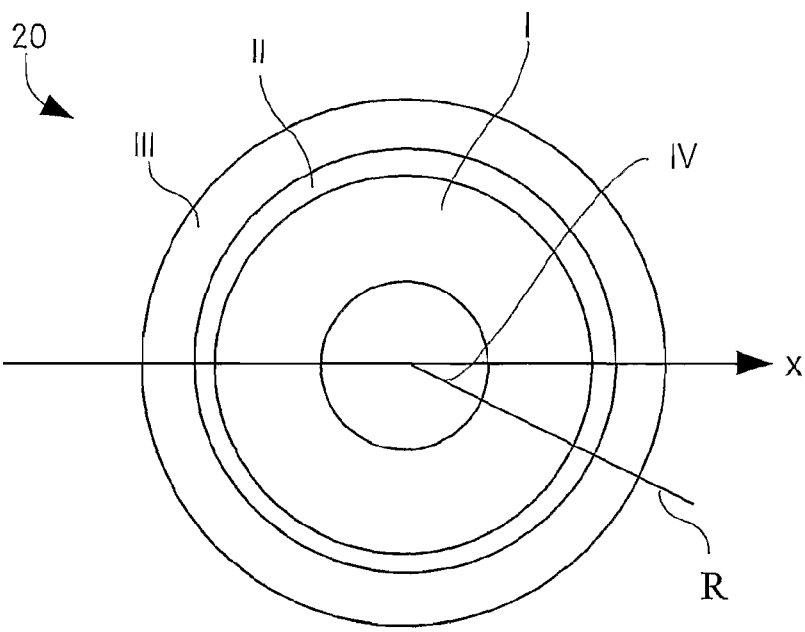
FIG. 5 a schematic illustration of a top view of a reactor according to the invention.

In this embodiment the basic shape of the electrode is circular and therefore the electrode 20 is axially symmetric with respect to an axis perpendicular to a first surface of the electrode 20. FIG. 5 shows such an electrode 20 from above, perpendicular with respect to a first surface of the electrode 20 or in direction of the y-axis respective as a contour plot. The areas I, II, III between the contour lines correspond to the first (I), second (II) and third segment (III) as described above. Area IV is essentially flat. A medium gradient along a radius R of the area I is less than one of area II and a medium gradient along a radius R of the area II is larger than one of area III.

Figure 6:
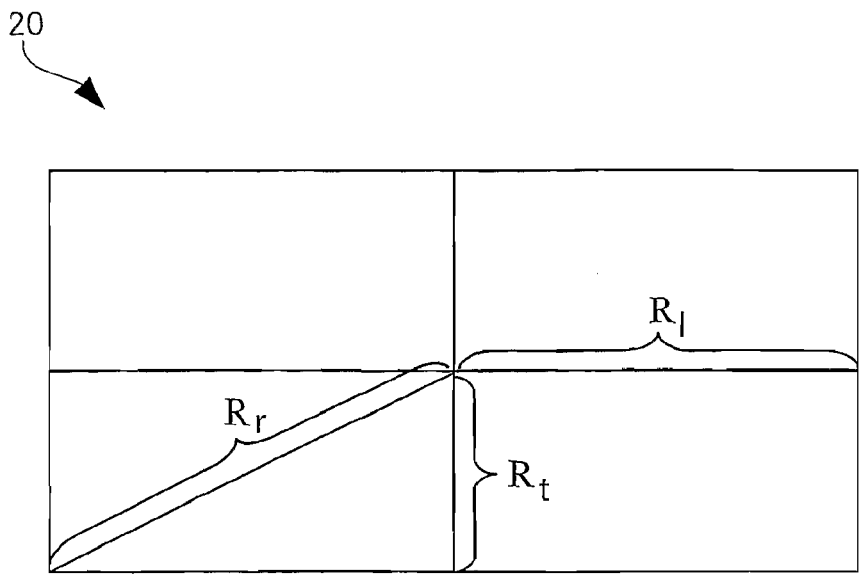

FIG. 6 shows an electrode 20 from above, perpendicular with respect to a first surface of the electrode 20. In this embodiment, the basic shape of the electrode 20 is rectangular. The profile depending from the distance from the centre along the x-axis as shown in FIG. 6 may be applied e.g. to a longitudinal radius $R_l$, a transversal radius $R_t$ and a diagonal radius $R_d$ as illustrated in FIG. 6 or to every other imaginable radius.

A shape of the layer could also be adapted to the shape of the substrate in such a manner that a non planar shaped substrate can be treated uniformly either. Further the shape of an electrode 20 could be adapted so that explicit non uniform treatment is achieved if wanted. The shape could be formed convex, which effects also in convex treatment. Moreover, it could be shaped in arbitrary ways. Also the design of the reactor 1 can be different; in fact the reactor can be any of known art.

In summary, it is to be noted that the invention creates an electrode of a plasma reactor that provides uniform plasma intensity along the surface of the substrate, especially for large size (surface) substrates and moreover allows a compact construction of the vacuum treatment apparatus.

The invention claimed is:

1. A plasma reactor for treating a substrate, comprising:
    a) two or more electrodes arranged within the reactor defining an internal process space there between, the electrodes (20, 30) being located opposed to each other and parallel with respect to a first surface of the electrodes;
    b) a gas inlet and a gas outlet for transporting gas in and out of the plasma reactor; and
    c) a radiofrequency generator connected to at least one of the electrodes, the at least one of the electrodes comprising a corrective layer having a non-planar shape along a surface facing the internal process space,
    wherein one or more of the electrodes comprises a corrective layer that has, in a first cross section along a radius of the electrode, a profile comprising a first segment, a second segment, and a third segment, the first, second, and third segments being consecutive and adjacent to each other,
    wherein f) the third segment is adjacent to an edge of the one or more of the electrodes,
    wherein g) a medium gradient in the first segment is less than a medium gradient in the second segment and a medium gradient in the second segment is greater than a medium gradient in the third segment, and
    wherein (h) the medium gradient of the first segment is between 0.003 and 0.013, the medium gradient of the second segment is between 0.018 and 0.044, and the medium gradient of the third segment is between 0.002 and 0.006.

2. A plasma reactor according to claim 1, wherein the first segment comprises a section in which the corrective layer is essentially flat.

3. A plasma reactor according to claim 2, wherein the section comprises between ⅙ and ⅓ of a radius of the corrective layer.

4. A plasma reactor according to claim 2, wherein the section comprises ¼ of a radius of the corrective layer.

5. A plasma reactor according to claim 1, wherein the medium gradient of the first segment is 0.006, the medium gradient of the second segment is 0.032, and the medium gradient of the third segment is 0.004.

6. A plasma reactor according to claim 1, wherein said layer comprises a solid dielectric layer, a gaseous dielectric layer, or a combination thereof.

7. A plasma reactor according to claim 6, wherein the gaseous dielectric layer is in gaseous communication with the internal process space.

8. A plasma reactor according to claim 1, wherein the one or more of the electrodes is circular or square or rectangular.

9. A plasma reactor according to claim 1, wherein the electrodes are shaped equally.

* * * * *

UNITED STATES PATENT AND TRADEMARK OFFICE
CERTIFICATE OF CORRECTION

PATENT NO. : 8,689,734 B2  Page 1 of 1
APPLICATION NO. : 12/680239
DATED : April 8, 2014
INVENTOR(S) : Ellert et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 813 days.

Signed and Sealed this

Twenty-ninth Day of September, 2015

Michelle K. Lee
*Director of the United States Patent and Trademark Office*